United States Patent
Scilla

(10) Patent No.: US 10,250,233 B2
(45) Date of Patent: Apr. 2, 2019

(54) METHOD FOR COMPENSATING EFFECTS OF SUBSTRATE STRESSES IN SEMICONDUCTOR DEVICES, AND CORRESPONDING DEVICE

(71) Applicant: STMicroelectronics S.r.l., Agrate Brianza (IT)

(72) Inventor: Giuseppe Scilla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 25 days.

(21) Appl. No.: 15/437,868

(22) Filed: Feb. 21, 2017

(65) Prior Publication Data

US 2018/0026609 A1  Jan. 25, 2018

(30) Foreign Application Priority Data

Jul. 22, 2016  (IT) .......................... 102016000077188

(51) Int. Cl.
| | |
|---|---|
| *H03K 3/011* | (2006.01) |
| *G01L 1/00* | (2006.01) |
| *G01R 17/12* | (2006.01) |
| *H01L 23/34* | (2006.01) |
| *G01B 7/16* | (2006.01) |
| *H01L 21/66* | (2006.01) |

(52) U.S. Cl.
CPC ............... *H03K 3/011* (2013.01); *G01B 7/18* (2013.01); *G01L 1/00* (2013.01); *G01R 17/12* (2013.01); *H01L 22/34* (2013.01); *H01L 23/34* (2013.01)

(58) Field of Classification Search
None
See application file for complete search history.

(56) References Cited

U.S. PATENT DOCUMENTS

| | | |
|---|---|---|
| 4,522,072 A | 6/1985 | Sulouff et al. |
| 6,184,561 B1 | 2/2001 | Tanaka et al. |
| 9,638,764 B2 * | 5/2017 | Cesaretti ............ G01R 33/0023 |
| 9,910,087 B2 * | 3/2018 | Eagen ................ G01R 31/2872 |
| 2007/0018655 A1 | 1/2007 | Ausserlechner et al. |

(Continued)

FOREIGN PATENT DOCUMENTS

| | | |
|---|---|---|
| CN | 105607018 A | 5/2016 |
| EP | 1840500 A2 | 10/2007 |

(Continued)

OTHER PUBLICATIONS

IT Search Report and Written Opinion for IT Appl. No. 102016000077188 dated May 8, 2017 (8 pages).

*Primary Examiner* — Cassandra Cox
(74) *Attorney, Agent, or Firm* — Crowe & Dunlevy

(57) ABSTRACT

A semiconductor substrate includes a first portion and a second portion. The first portion of the substrate has a first deformation-stress sensor capable of supplying a first stress signal. The second portion of the substrate has a second deformation-stress sensor capable of supplying a second stress signal. The first stress signal and second stress signal are processed by a circuit to produce a compensation signal. The compensation signal is applied in feedback to one of the first and second stress signals to compensate for variations induced in said one of the first and second stress signals by stresses in the semiconductor substrate.

29 Claims, 2 Drawing Sheets

(56) References Cited

U.S. PATENT DOCUMENTS

2008/0007920 A1* 1/2008 Shiraki ................ H02M 7/003
                                                     361/717
2011/0113891 A1   5/2011 Hayner et al.
2014/0118060 A1   5/2014 Yayama et al.

FOREIGN PATENT DOCUMENTS

EP           2988136 A1   2/2016
WO    WO-2012013977 A1   2/2012

* cited by examiner

METHOD FOR COMPENSATING EFFECTS OF SUBSTRATE STRESSES IN SEMICONDUCTOR DEVICES, AND CORRESPONDING DEVICE

PRIORITY CLAIM

This application claims the priority benefit of Italian Application for Patent No. 102016000077188, filed on Jul. 22, 2016, the disclosure of which is hereby incorporated by reference in its entirety.

TECHNICAL FIELD

The present disclosure relates to semiconductor devices.

One or more embodiments may be applied to the compensation of effects induced by substrate stresses in semiconductor devices.

BACKGROUND

In the manufacture of semiconductor devices, an important aspect is represented by the possible role of the package of the device.

One of the lines followed in the context of reduction of costs of these devices is hence the reduction in the cost of the package, pursued, for example, through a reduction of the costs of the metal frames (on which the chip is attached) and of the resins inside the package.

Such a saving may have an effect on the thicknesses of the frames and/or on the quality of the resins and may result—in particular in devices of a low-cost type, designed to be used in consumer goods—in effects such as a shift in the output voltage $V_{OUT}$ of the device after assembly.

Such a phenomenon may be amplified by the possible development of stresses, in the sense that it is possible to detect a discrepancy between, for example, the output value $V_{OUT}$ obtained at the level of electrical wafer sorting (EWS) after so-called "trimming" of the device and the values $V_{OUT}$ that can be detected after packaging of the chip.

The above phenomenon may be at least in part attributed to the pressure that the resin exerts on the surface of the chip. This pressure may induce a deformation of the chip, with a consequent distortion of the crystal lattice of the semiconductor material (e.g., silicon), with the effect of distortion, which may be more marked in the presence of frames, with values of thickness that, being smaller than standard values, are exposed to a significant degree of bending.

By way of example, it is possible to encounter values of voltage shift that may range between 3 mV and 5 mV and reach, in some cases, values in the region of 100 mV. Values of shift of +/−3 mV up to +/−12 mV may be found in normal production in the case of large production lots.

The direction of the shift may be unforeseeable, and hence be either positive or negative according to the type of package, with the possibility of encountering for one and the same chip different values of voltage shift—both as regards modulus and direction—according to the package in which the chip is assembled.

In such a context, there is in general felt the need to have available solutions that will enable control of these shifts, there being desirable also a reduction in costs for carrying out tests.

In this perspective, it has been proposed to trim the device after packaging, using, for example, an external pin, without inserting in the chip circuit blocks programmable from outside. This solution, albeit interesting, presents limits in terms of occupation of space and increase in cost of the die so that it can be considered inapplicable to standard production devices.

There is a need in the art to contribute to meeting the need outlined above, overcoming the limits referred to previously.

SUMMARY

The claims form an integral part of the technical teachings provided herein in relation to the embodiments exemplified in the description.

One or more embodiments enable one or more important advantages to be achieved.

For instance, it is possible to implement a sort of self-regulation of the shift (e.g., a voltage shift) irrespective of the modulus and direction of the shift induced by stresses in the crystal lattice, it being possible to achieve this result without requiring any intervention from outside.

It is likewise possible to pursue a zeroing or, at least, a reduction in the shift of parameters that can be maintained over time, throughout the expected service life of the device. At an application level, also in the presence of variations of the stresses following upon mechanical variations or temperature variations, one or more embodiments may, for example, maintain a constant supplied voltage.

A further advantage may be linked to the possibility of providing solutions that are in effect transparent to stresses, with the capacity of providing a practically zero correction in the presence of a limited lattice stress and of then being activated, even subsequently (e.g., after sealing of the package), in the case where there is, for example, a modification of the crystal lattice.

A further advantage may be appreciated at the level of production yield in so far as it may be possible to skip some control steps (e.g., verifications of the output voltage $V_{OUT}$), with the possibility of achieving shift values that are constant irrespective of the package and may be contained within a limited range, for instance in the region of +/−3 mV.

One or more embodiments may hence offer features such as:

automatic correction (e.g., of the output voltage $V_{OUT}$ of the device) after packaging, without any external intervention;

correction that can remain active irrespective of the conditions of use of the device (at the level both of stresses due to the assembly process and of thermal stresses); and possibility of facilitating achievement of constancy of one or more parameters, such as the output voltage $V_{OUT}$, of a reference generator or of a regulator throughout the service life of the device.

BRIEF DESCRIPTION OF THE DRAWINGS

One or more embodiments will now be described, purely by way of non-limiting example, with reference to annexed drawings, wherein.

DETAILED DESCRIPTION

In the ensuing description, various specific details are illustrated in order to provide an in-depth understanding of various examples of embodiments of the present disclosure. The embodiments may be obtained without one or more of the specific details, or with other methods, components, materials, etc. In other cases, known structures, materials, or operations are not illustrated or described in detail so that the various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of the present description do not necessarily refer exactly to one and the same embodiment. Moreover, particular conformations, structures, or characteristics may be adequately combined in one or more embodiments.

The references used herein are provided merely for convenience and hence do not define the sphere of protection or the scope of the embodiments.

In one or more embodiments, a semiconductor device may be configured in such a way as to be able to "realize" the value and the direction of a shift induced in an operating parameter of the device by stresses in the substrate, for example, a silicon substrate. Added to this is the capacity of intervening to correct automatically the resulting shift without there being required for this purposes any intervention of trimming from outside.

One or more embodiments may find application in a wide range of devices, irrespective of the technology used.

In some cases, to which reference will be made in what follows—purely by way of example—it is possible to apply one or more embodiments to technologies of a bipolar type, for example in the field of voltage regulators or precision reference generators developed in bipolar technology. Of course, reference to bipolar technology is not to be understood as in any way limiting the scope of the embodiments.

Figure 1:
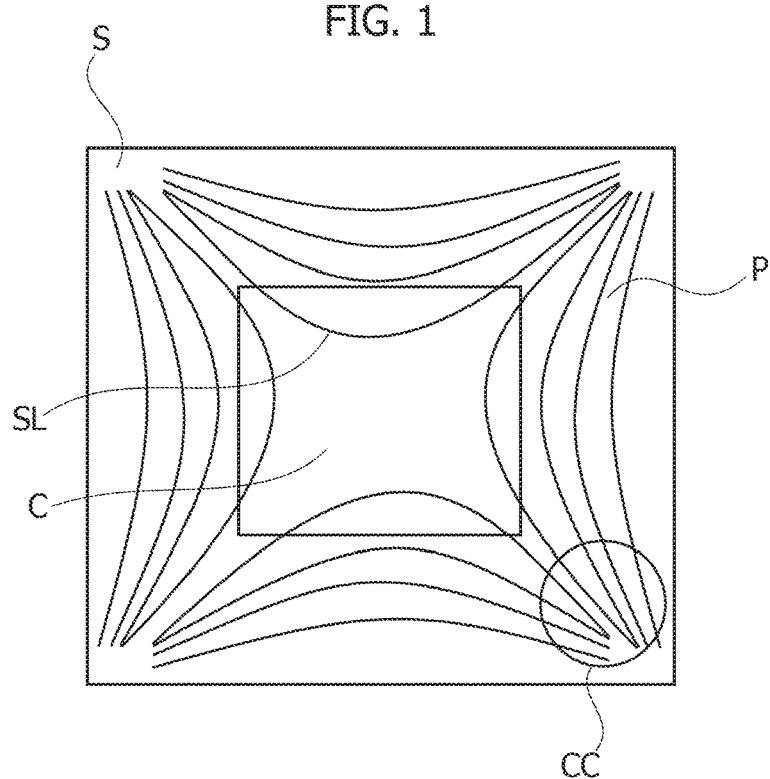
FIG. 1 is a schematic representation of onset of stresses in a semiconductor chip.

FIG. 1 is a schematic illustration of a chip or die S of semiconductor material (e.g., silicon), for example having a square shape: reference to such a shape is of course purely exemplary in so far as the considerations developed in what follows may apply to a chip of any shape. More particularly, the chip is a packaged chip meaning that the chip is encapsulated within a packaging material (such as a resin) and is mounted to a support structure (such as a lead frame).

Assuming an application of a deformation to the chip or die S, for example a bending deformation, it is possible to find that (in a way on the other hand quite evident) the central area, designated by C, may present a lower density of stress lines SL as compared to the areas located at the edges and at the corners, such as the area designated by CC. In these "peripheral" areas it is possible to discern a greater lattice distortion than in the central area C.

At least to a first approximation, in a peripheral and corner area, such as the area enclosed in the circle CC in FIG. 1, there will be the highest value of stress, whereas the lowest (minimum) value of stress will be detected in the central area C, in particular around the center of the chip or die S.

Assuming that a diffused resistor (e.g., of a p-body type) is located in a given area of the chip or die S, it is possible to consider using such a diffused resistor, possibly organized in modules, as sensor of lattice distortion.

In particular, it is possible to define a factor K according to a relation of the type:

$$K=(\Delta R/R_0)/\varepsilon \text{ where:}$$

$R_0$ is the initial value of resistance;

$\Delta R$ is the variation of this resistance induced by a deformation stress of the chip S; and $\varepsilon=\Delta L/L_0$ is the deformation undergone by the resistor in the lengthwise direction.

A factor like the factor K may be defined as a "gauge factor". For instance, it may be found to assume values in the region of 2 to 4 for metal films and values of 100 to 200 for structures diffused on a crystal lattice. In other words, given the same deformation, a diffused sensor may present a variation higher than a metal sensor.

A possibility of countering the effects of deformation stresses may be to position the more sensitive structures of the semiconductor device in the central area C. A choice of this kind may, however, be limiting and in many cases difficult to pursue, above all if the dimensions of the die S involved are very small.

In the case of power applications, the situation may be even more critical considering the fact that the central region C may be located closer to the temperature source, hence being more exposed to the thermal wave.

One or more embodiments may envisage generating an electrical signal that is able to take into account the "differential" mechanical deformation that may be created between a resistor (or a number of resistor modules) set in an area of the chip S that presents low deformation (e.g., in the central area C) and a resistor (or a number of resistor modules) located in an area with higher deformation, for example in an area such as the area CC in FIG. 1. In this way, it is possible to generate an electrical signal indicating not only the modulus of the aforesaid variation, but also of the sign of the variation itself.

In one or more embodiments it is thus possible to provide a circuit capable of compensating (automatically) this variation: for example, it is possible to envisage a high level of compensation in the presence of a relatively large signal, whereas, in the case where (at least at a hypothetical level) no differential signal is detected, it is possible to envisage a compensation of a virtually zero value.

In other words, in one or more embodiments, a correction circuit may be provided that will be "transparent" in regard to operation of the device.

One or more embodiments may find application, for example, in an integrated reference-voltage generator, in which a (pre)regulated voltage is present. By associating to such a circuit a differential signal indicating the lattice distortion (difference of deformation between, for example, the central area C and a peripheral/corner area CC), it is possible to envisage an action of compensation over a wide range temperatures, for example in a range from −40° C. to 150° C.

Figure 2:
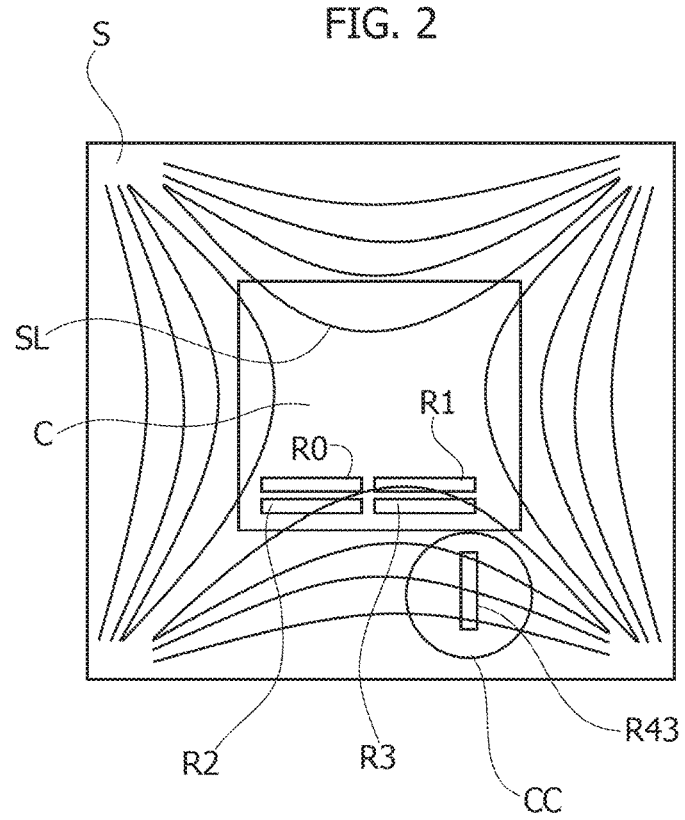
FIG. 2 exemplifies possible modalities of detection of the above stresses in one or more embodiments.

FIG. 2 exemplifies (with reference to a chip or die S substantially corresponding to the one described with reference to FIG. 1) the possible arrangement of four resistors R0, R1, R2, R3 in the central area C (low deformation) with a further resistor R43 located, instead, in an area of high deformation, such as the area CC described previously.

Figure 3:
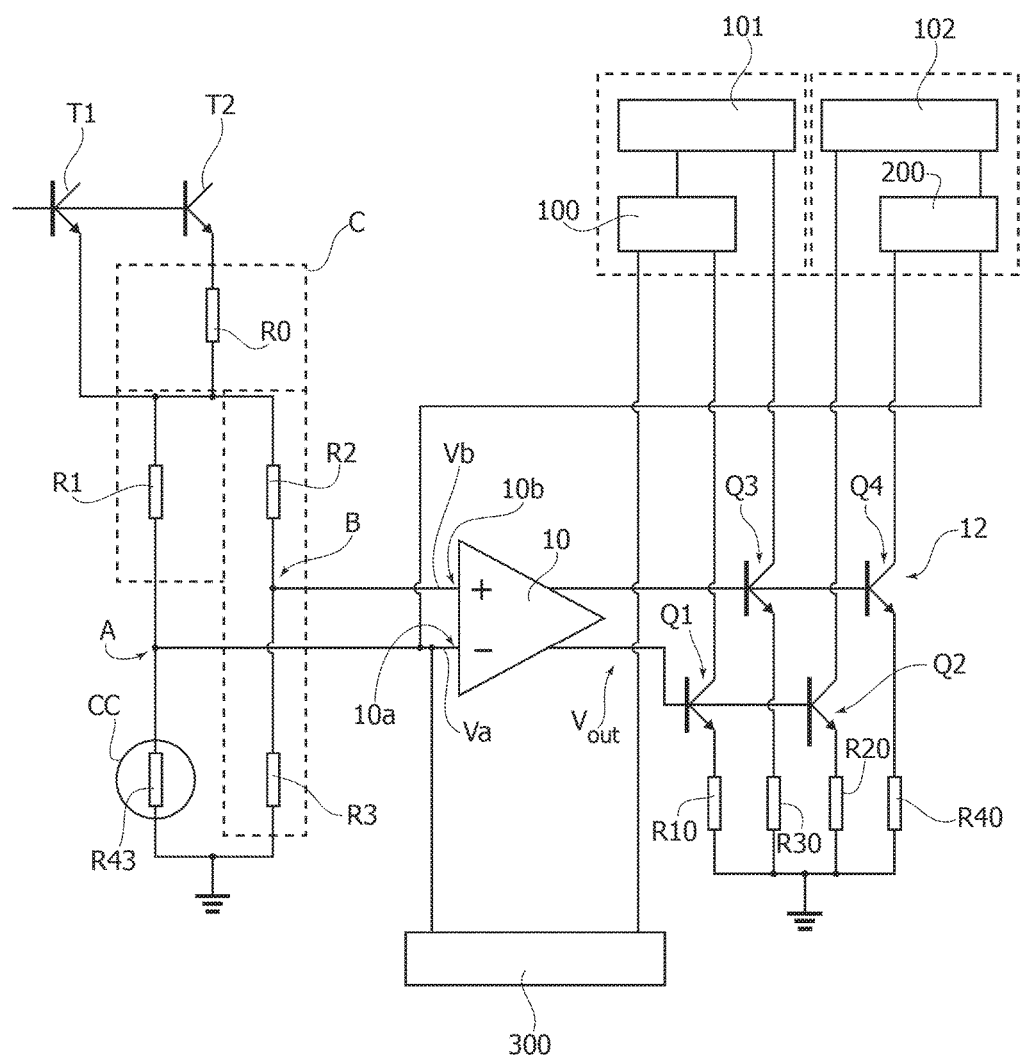
FIG. 3 is a circuit diagram of one or more embodiments.

The circuit diagram of FIG. 3 exemplifies how the aforesaid resistors (R0, R1, R2, R3 in the area of low deformation C, and R43 in the area of high deformation CC) may be coupled in a sensor circuit constituting a sort of Wheatstone bridge, which may be inserted in the electrical circuit of a semiconductor device housed in the chip or die S.

The above configuration is largely independent of the nature and characteristics of the circuit in question. Purely by way of orientative reference, the case of an integrated reference-voltage generator may be considered.

For instance, the resistors R1, R2, R43, and R3 may be viewed as constituting the four branches of a Wheatstone bridge that may be supplied, for example, via two transistors (e.g., bipolar transistors) T1 and T2 comprised in the aforesaid circuit (e.g., as transistors of the bandgap cell), with the resistor R0 set between the transistor T2 and the bridge.

The output of the Wheatstone bridge, acquired between the points A and B, may be supplied to the inputs, i.e., the inverting input 10a and the non-inverting input 10b, of a differential stage (comparator) 10, which generates at output a voltage signal $V_{out}$.

For simplicity of explanation, there may here be considered the (differential) output $V_{out}$ of the stage 10 as exemplifying a parameter that, following upon stresses in the chip or die S (e.g., ones induced by the package of the device), could be subject to an undesirable shift, which is, instead, in one or more embodiments, to be compensated, for example automatically.

In one or more embodiments, the output $V_{out}$ may be "sensed" by a stage 12, comprising, for example, four transistors such as bipolar transistors Q1, Q2, Q3, and Q4 that may implement an action of shift-compensation feedback towards the input of the stage 10.

Purely by way of example, to illustrate a possible operation of the circuit configuration exemplified in FIG. 3, it may be assumed that the resistor R43, located in the area with higher deformation CC, may be subject to:
  an increase in its value of resistance, such as to unbalance the bridge R1, R2, R3, R43 in a first direction, when the deformation of the chip acts, for example, in the "concave" direction; and
  a reduction in its value of resistance, such as to unbalance the bridge R1, R2, R3, R43 in a second direction, opposite to the first, when the deformation of the chip acts, for example, in the "convex" direction.

For the rest, it may be assumed that the other resistors of the bridge R1, R2, and R3 (like the resistor R0) preserve in a practically unvaried way their value of resistance irrespective of the deformation of the die S, being located in the central area C, where the effects of the stresses are substantially insignificant.

Consequently, the voltage at the point A between the resistors R1 and R43 (here designated by Va) can vary as a function of the mechanical stress undergone by the resistor R43 located in the area CC with high stress, whereas the voltage at the point B between the resistors R2 and R3 (here designated by Vb) will be subjected to lower, practically negligible, variations given that the resistors R2 and R3 are located in the area designated by C, i.e., in an area with low stress.

In one or more embodiments, the transistors Q1, Q2, Q3, and Q4 are connected at their bases (in general, at their control electrode, considering the fact that one or more embodiments may use, instead of bipolar transistors, field-effect transistors, where the role of control electrode is performed by the gate) to the output of the comparator stage 10.

In one or more embodiments as exemplified herein, the stage 10 may present two output terminals (between which the voltage $V_{out}$ is detected) and two inputs. The latter are denoted by the symbols + and − to highlight the fact that the input signal (point A) may be differential, i.e., it may be positive or negative with respect to point B.

For instance, by way of illustration (and with reference to the example of operation described in what follows) it may be assumed that, as the voltage Va at point A decreases, i.e., in the presence of a reduction of the voltage at the inverting input 10a of the stage 10, the correction/compensation signal on Va may be obtained through an injection of a current into the input 10a.

Instead, if the voltage Va rises, the corresponding current signal may be drawn from the node A, i.e., it will be negative, it being thus possible to view the input 10a as inverting input of the stage.

In one or more embodiments, the transistors Q1, Q2, Q3, and Q4 may be connected with their current-generation terminal (emitter, in the case of bipolar transistors; source, in the case of field-effect transistors) to ground, for example with interposition of respective biasing resistors R10, R20, R30, R40.

As regards, then, the current-dissipation terminals (collector, in the case of bipolar transistors; drain, in the case of field-effect transistors) in one or more embodiments the connection arrangement may be the following:
  transistor Q1: connection to a first current mirror 100;
  transistor Q3: connection to a first control circuit 101 of the first current mirror 100;
  transistor Q4: connection to a second current mirror 200; and
  transistor Q2: connection to a second control circuit 102 of the second current mirror 200.

Again, in one or more embodiments, a third current mirror, designated by 300, may be set between the first current mirror 100 and one of the inputs (e.g., the non-inverting input 10a) of the comparator 10, to which also the second current mirror 200 is connected.

In one or more embodiments, the control circuits 101 and 102 may comprise current mirrors that are substantially the same as the controlled current mirrors 100 and 200, hence in current differentials.

Assuming first of all that the value of the resistor R43 tends to decrease as a result of the mechanical stress in the area CC, a corresponding reduction in Va applied to the input 10a of the stage 10 may lead to a lowering of the voltage level on the bases of the transistors Q1 and Q2 connected to one of the output terminals of the differential stage 10, causing both of these transistors Q1 and Q2 to have a collector current lower than the current that flows in the transistors Q3 and Q4, which are connected with their bases to the other output terminal of the stage 10.

In these conditions, the transistor Q1 will tend to mirror its collector current on the first current mirror 100, while also the transistor Q3 will tend to mirror its current on the control circuit 101 of the first mirror 100.

With the current of the transistor Q3 on the control circuit 101 higher than the current of the transistor Q1 on the current mirror 100, there will occur switching-off of the current differential in conditions whereby no current will be mirrored on the third current mirror 300.

In other words, in one or more embodiments, if the current mirror supplies a lower current—on account of the decrease in Va—and the circuit 101 supplies the same current—given that Vb does not vary—the current I(101) of the circuit 101 will be higher than the current I(100) of the mirror 100. Since the circuit 101 is connected to the bases of the mirror 100 in current-differential configuration (i.e., with an output current given by the difference of the currents of the two mirrors), the current I(101) prevails over the current I(100), acting on the diode of the mirror 100, causing, for example, the collector of a pnp transistor of the mirror 100 not to be able to supply current, thus causing switching-off of the current differential.

At the same time (once again in the conditions where it is assumed that Va<Vb as a result of a reduction in the value of resistance of the resistor R43), the transistor Q2 will tend to mirror a current on the control circuit 102 lower than the current mirrored by the transistor Q4 on the second current mirror 200.

In this case, the second current mirror 200 may supply a differential current (given by the difference of the currents through the transistors Q2 and Q4) towards the point designated by A.

This incoming current injected into the node A will have a value depending upon the differential value Vb−Va so that since Va is lower there will be generation of a voltage differential ΔV such as to compensate the reduction in voltage Vout due to the lattice distortion of the material of the die S.

It will be appreciated that in one or more embodiments, the voltage Vout may be a reference voltage, applied, for example, to the bases of the transistors T1 and T2.

In conditions complementary to the ones described, i.e., in the presence of a stress of the material of the die S such as to induce an increase in the resistance of R43 (i.e., in conditions such that Va>Vb), then the base-to-emitter voltages Vbe of the transistors Q1 and Q2 will rise with their collector currents such as to prevail over those of the transistors Q3 and Q4.

In this case, the current mirror 200 will be switched off, since the control current supplied by the transistor Q2 is higher than the one supplied by the transistor Q4.

Instead, the current differential constituted by the control circuit 101 and the current mirror 100 will manage to supply a differential current, which, mirrored by the current mirror 300, will present as a current exiting from the node A.

The reason for the foregoing is that, in these conditions, as exemplified herein, I(100) is higher than I(101), so that the mirror 101 may be able to supply a lower current that consequently it will "draw" from the diode of the mirror 100. Seeing that this diode is "drawing" more current, thanks to the fact that Va>Vb, the mirror 100 will manage to prevail by supplying a differential current that is to be mirrored by the mirror 300 on the node A. This differential current on the node A will make it possible to reduce the voltage Va proportionally and bring it back to the value as if there had been no deformation.

In this way, by drawing excess current from this node, it will be possible to bring the voltage Va to a value approximately corresponding to Vb, thus countering the variation of Vout induced by the stress of the semiconductor material, so bringing the value of the reference voltage Vout to the desired value prior to the variation induced by the mechanical stress.

Tests conducted on the circuit have demonstrated the effectiveness of this action of correction in the presence of variations of the value of resistance R43 over a rather wide range, for example with values of 2.5 kΩ, 5 kΩ, and 10 kΩ, in the presence both of stresses such as to determine an increase in the value of resistance R43 and in the presence of stresses such as to induce a reduction of this resistance, hence in the presence both of tensile stresses and in the presence of compressive stresses of the resistor R43.

One or more embodiments may hence regard a method for compensating variations induced in a signal (e.g., Vout) generated in a semiconductor device by stresses in the substrate (e.g., S) of the semiconductor device, the method including:
  coupling at least one first deformation-stress sensor (e.g., R43) to a first portion (e.g., CC) of the substrate of the semiconductor device, said at least one first stress sensor supplying a first stress signal (e.g., Va);
  coupling at least one second deformation-stress sensor (e.g., R1, R2, R3) to a second portion (e.g., C) of the substrate of the semiconductor device, said at least one second stress sensor supplying a second stress signal (e.g., Vb);
  processing (e.g., in 12, 100, 101, 102, 200, 300) said first stress signal and said second stress signal for producing at least one compensation signal (e.g., the signals applied by 200, 300 to the input 10a) as a function of said first stress signal and of said second stress signal; and
  compensating (e.g., applying to the input 10a the signals of 200, 300) said signal generated (e.g., Vout) in the semiconductor device as a function of said at least one compensation signal.

One or more embodiments may include:
  coupling said at least one second stress sensor to a portion of the substrate of the semiconductor device located at the centre of the substrate; and
  coupling said at least one first stress sensor to a portion of the substrate located peripherally to the substrate with respect to said central portion.

In one or more embodiments, the signal generated in the semiconductor device may comprise an output signal of a generator stage (e.g., the comparator stage 10), and the method may include applying said at least one compensation signal to the input of said generator stage.

One or more embodiments may include compensating said signal generated by the semiconductor device as a function of the at least one compensation signal by injecting current into or drawing current from the input (e.g., 10a) of the generator stage.

In one or more embodiments, a semiconductor device may comprise a substrate with a first portion (e.g., CC) and a second portion (e.g., C), with:
  at least one first deformation-stress sensor coupled to said first portion of the substrate of the semiconductor device, said at least one first stress sensor supplying a first stress signal;
  at least one second deformation-stress sensor coupled to said second portion of the substrate of the semiconductor device, said at least one second stress sensor supplying a second stress signal; and
  a processing circuit coupled to said at least one first deformation-stress sensor and to said at least one second deformation-stress sensor and configured for:
  processing said first stress signal and said second stress signal for producing at least one compensation signal as a function of said first stress signal and of said second stress signal; and
  applying said at least one compensation signal to a signal generated by the semiconductor device to compensate variations induced in said signal generated by stresses in the substrate of the semiconductor device.

In one or more embodiments, the at least one first stress sensor and the at least one second stress sensor may be coupled in a Wheatstone-bridge configuration for supplying an output signal of the bridge (e.g., Vb−Va) indicating the deformation of the substrate.

In one or more embodiments:
  said second portion of the substrate may comprise a central portion of the substrate itself; and
  said first portion of the substrate may comprise a portion of said substrate located in a position peripheral with respect to said central portion.

One or more embodiments may include a generator stage (e.g., the differential stage 10) for generating at output the generated signal, where the processing circuit is coupled to the generator stage for applying the at least one compensation signal at input to said generator stage.

One or more embodiments may include:
at least one current mirror driven by said generator stage; and
at least one feedback path that couples said at least one current mirror to the input of said generator stage, where said at least one current mirror couples said at least one compensation signal at input to said generator stage.

One or more embodiments may include:
a first current mirror (e.g., 100), a second current mirror (e.g., 200), and a third current mirror (e.g., 300), wherein said second and third current mirrors are configured, respectively, for injecting current into and drawing current from the input of said generator stage;
said second current mirror and said third current mirror being alternately activatable as a function of activation of said first current mirror.

Without prejudice to the underlying principles, the details of construction and the embodiments may vary, even significantly, with respect to what has been illustrated herein purely by way of non-limiting example, without thereby departing from the extent of protection. The extent of protection is defined by the annexed claims.

The invention claimed is:

1. A semiconductor device including a substrate with a first portion and a second portion, the semiconductor device including:
at least one first deformation stress sensor coupled with said first portion of the substrate of the semiconductor device, said at least one first deformation stress sensor providing a first stress signal;
at least one second deformation stress sensor coupled with said second portion of the substrate of the semiconductor device, said at least one second deformation stress sensor providing a second stress signal;
a processing circuit coupled with said at least one first deformation stress sensor and said at least one second deformation stress sensor and configured for:
processing said first stress signal and said second stress signal and producing at least one compensation signal as a function of said first stress signal and said second stress signal;
applying said at least one compensation signal to the first stress signal to compensate for variations induced by stresses in the substrate of the semiconductor device.

2. The semiconductor device of claim 1, wherein said at least one first deformation stress sensor and said at least one second deformation stress sensor are coupled in a Wheatstone bridge arrangement to provide a bridge output signal indicative of the deformation of said substrate.

3. The semiconductor device of claim 1, wherein:
said second portion of the substrate includes a central portion of the substrate; and
said first portion of the substrate includes a portion of said substrate located peripherally with respect to said central portion.

4. The semiconductor device of claim 1, wherein the processing circuit comprises a generator stage having a first input configured to receive both the first stress signal and the at least one compensation signal, the generator stage generating at its output an output signal from which the at least one compensation signal is generated.

5. The semiconductor device of claim 4, wherein the processing circuit further comprises:
at least one current mirror driven by said generator stage; and
at least one feedback path coupling said at least one current mirror with the first input of said generator stage to apply said at least one compensation signal to the first input of said generator stage.

6. The semiconductor device of claim 5, wherein said at least one current mirror comprises:
first, second and third current mirrors, wherein said second and third current mirrors are configured for injecting and drawing current into and from the first input of said generator stage, respectively,
said second current mirror and said third current mirror being alternatively activatable as a function of said first current mirror being activated.

7. A method of compensating variations induced in a signal generated in a semiconductor device by stresses in the substrate of said semiconductor device, the method including:
coupling at least one first deformation stress sensor to a first portion of the substrate of the semiconductor device, said at least one first stress sensor providing a first stress signal;
coupling at least one second deformation stress sensor to a second portion of the substrate of the semiconductor device, said at least one second stress sensor providing a second stress signal;
processing said first stress signal and said second stress signal to produce at least one compensation signal as a function of said first stress signal and said second stress signal; and
compensating variations in said signal generated in the semiconductor circuit as a function of said at least one compensation signal;
wherein said signal generated in the semiconductor circuit includes an output signal of a generator stage, and compensating comprises applying said at least one compensation signal at an input of said generator stage; and
wherein applying comprises injecting current into or drawing current from the input of said generator stage.

8. The method of claim 7, including:
coupling said at least one second deformation stress sensor with a portion of the substrate of the semiconductor device located centrally of the substrate; and
coupling said at least one first deformation stress sensor with a portion of the substrate of the semiconductor device located peripherally with respect to said central portion.

9. A semiconductor device, comprising:
a packaged semiconductor chip subject to a bending deformation which induces a relatively higher degree of stress in a first portion of the semiconductor chip and a relatively lower degree of stress in a second portion of the semiconductor chip;
a stress sensing circuit comprising:
a first resistor element located within the first portion of the semiconductor chip; and
a second resistor element located within the second portion of the semiconductor chip;
a differential amplifier circuit having a first input connected to the first resistor element and a second input connected to the second resistor element; and
a negative feedback circuit having an input coupled to an output of the differential amplifier circuit and an output configured to generate a feedback current that is one of sourced to or sunk from the first input of the differential amplifier circuit.

10. The semiconductor device of claim 9, wherein the first and second resistors are resistor components of a Wheatstone bridge circuit.

11. The semiconductor device of claim 9, wherein:
the first portion of the semiconductor chip is located adjacent a corner of the semiconductor chip; and
the second portion of the semiconductor substrate is located in a central region of the semiconductor chip.

12. The semiconductor device of claim 9, wherein the negative feedback circuit comprises:
a first current mirroring circuit configured to generate the feedback current sourced to the first input of the differential amplifier circuit;
a second current mirroring circuit configured to generate the feedback current sunk from the first input of the differential amplifier circuit; and
control circuitry configured to alternatively activate the first and second current mirrors in response to the output of the differential amplifier circuit.

13. The semiconductor device of claim 12, wherein the output of the differential amplifier circuit comprises a first output and second output having a differential signal relationship, and wherein:
the first and second current mirroring circuits each have a first current source transistor driven by the first output; and
the control circuit has second current source transistors driven by the second output and a current comparison circuitry configured to compare currents from the first and second current source transistors to control alternative activation of the first and second current mirrors.

14. A semiconductor device including a substrate with a first portion and a second portion, the semiconductor device including:
at least one first deformation stress sensor coupled with said first portion of the substrate of the semiconductor device, said at least one first deformation stress sensor providing a first stress signal;
at least one second deformation stress sensor coupled with said second portion of the substrate of the semiconductor device, said at least one second deformation stress sensor providing a second stress signal;
wherein said at least one first deformation stress sensor and said at least one second deformation stress sensor are coupled in a Wheatstone bridge arrangement with the first and second stress signals being indicative of the deformation of said substrate
a processing circuit coupled with said at least one first deformation stress sensor and said at least one second deformation stress sensor and configured for:
processing said first stress signal and said second stress signal and producing at least one compensation signal as a function of said first stress signal and said second stress signal;
applying said at least one compensation signal to a signal generated by the semiconductor circuit by compensating variations induced in said generated signal by stresses in the substrate of the semiconductor device.

15. The semiconductor device of claim 14, wherein:
said second portion of the substrate includes a central portion of the substrate; and
said first portion of the substrate includes a portion of said substrate located peripherally with respect to said central portion.

16. The semiconductor device of claim 14, including a generator stage for generating at its output said generated signal, wherein said processing circuit is coupled with said generator stage for applying said at least one compensation signal at the input of said generator stage.

17. The semiconductor device of claim 16, including:
at least one current mirror driven by said generator stage; and
at least one feedback path coupling said at least one current mirror with the input of said generator stage, said at least one current mirror coupling said at least one compensation signal with the input of said generator stage.

18. The semiconductor device of claim 17, including:
first, second and third current mirrors, wherein said second and third current mirrors are configured for injecting and drawing current into and from at the input of said generator stage, respectively,
said second current mirror and said third current mirror being alternatively activatable as a function of said first current mirror being activated.

19. A semiconductor device including a substrate with a first portion and a second portion, the semiconductor device including:
at least one first deformation stress sensor coupled with said first portion of the substrate of the semiconductor device, said at least one first deformation stress sensor providing a first stress signal;
at least one second deformation stress sensor coupled with said second portion of the substrate of the semiconductor device, said at least one second deformation stress sensor providing a second stress signal;
wherein said second portion of the substrate includes a central portion of the substrate, and said first portion of the substrate includes a portion of said substrate located peripherally with respect to said central portion;
a processing circuit coupled with said at least one first deformation stress sensor and said at least one second deformation stress sensor and configured for:
processing said first stress signal and said second stress signal and producing at least one compensation signal as a function of said first stress signal and said second stress signal;
applying said at least one compensation signal to a signal generated by the semiconductor circuit by compensating variations induced in said generated signal by stresses in the substrate of the semiconductor device.

20. The semiconductor device of claim 19, including a generator stage for generating at its output said generated signal, wherein said processing circuit is coupled with said generator stage for applying said at least one compensation signal at the input of said generator stage.

21. The semiconductor device of claim 20, including:
at least one current mirror driven by said generator stage; and
at least one feedback path coupling said at least one current mirror with the input of said generator stage, said at least one current mirror coupling said at least one compensation signal with the input of said generator stage.

22. The semiconductor device of claim 21, including:
first, second and third current mirrors, wherein said second and third current mirrors are configured for injecting and drawing current into and from at the input of said generator stage, respectively, said second current mirror and said third current mirror being alternatively activatable as a function of said first current mirror being activated.

23. A method of compensating variations induced in a signal generated in a semiconductor device by stresses in the substrate of said semiconductor device, the method including:
coupling at least one first deformation stress sensor to a first portion of the substrate of the semiconductor device located centrally of the substrate, said at least one first stress sensor providing a first stress signal;
coupling at least one second deformation stress sensor to a second portion of the substrate of the semiconductor device located peripherally with respect to said central portion, said at least one second stress sensor providing a second stress signal;
processing said first stress signal and said second stress signal to produce at least one compensation signal as a function of said first stress signal and said second stress signal; and
compensating variations in said signal generated in the semiconductor circuit as a function of said at least one compensation signal.

24. The method of claim 23, wherein said signal generated in said semiconductor circuit includes an output signal of a generator stage, the method including applying said at least one compensation signal at the input of said generator stage.

25. The method of claim 24, including compensating said signal generated in the semiconductor circuit as a function of said at least one compensation signal by injecting current into or drawing current from the input of said generator stage.

26. A semiconductor device, comprising:
a first resistor element located within a first portion of a semiconductor substrate; and
a second resistor element located within a second portion of the semiconductor substrate;
a differential amplifier circuit having a first input connected to the first resistor element and a second input connected to the second resistor element; and
a negative feedback circuit having an input coupled to an output of the differential amplifier circuit and an output configured to generate a feedback current that is one of sourced to or sunk from the first input of the differential amplifier circuit.

27. The semiconductor device of claim 26, wherein the first and second resistors are resistor components of a Wheatstone bridge circuit.

28. The semiconductor device of claim 26, wherein the negative feedback circuit comprises:
a first current mirroring circuit configured to generate the feedback current sourced to the first input of the differential amplifier circuit;
a second current mirroring circuit configured to generate the feedback current sunk from the first input of the differential amplifier circuit; and
control circuitry configured to alternatively activate the first and second current mirrors in response to the output of the differential amplifier circuit.

29. The semiconductor device of claim 28, wherein the output of the differential amplifier circuit comprises a first output and second output having a differential signal relationship, and wherein:
the first and second current mirroring circuits each have a first current source transistor driven by the first output; and
the control circuit has second current source transistors driven by the second output and a current comparison circuitry configured to compare currents from the first and second current source transistors to control alternative activation of the first and second current mirrors.

* * * * *